(12) United States Patent
Kang et al.

(10) Patent No.: US 7,560,319 B2
(45) Date of Patent: Jul. 14, 2009

(54) METHOD FOR FABRICATING A SEMICONDUCTOR DEVICE

(75) Inventors: Sung-Kwan Kang, Seoul (KR);
Yu-Gyun Shin, Gyeonggi-do (KR);
Jong-Wook Lee, Gyeonggi-do (KR);
Yong-Hoon Son, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 284 days.

(21) Appl. No.: 11/730,262

(22) Filed: Mar. 30, 2007

(65) Prior Publication Data

US 2007/0231976 A1    Oct. 4, 2007

(30) Foreign Application Priority Data

Apr. 3, 2006    (KR) .................. 10-2006-0030095

(51) Int. Cl.
*H01L 21/84* (2006.01)
(52) U.S. Cl. .................. 438/154; 257/E21.561; 438/231; 438/275
(58) Field of Classification Search ......... 438/151–166, 438/231, 275, 285
See application file for complete search history.

(56) References Cited

U.S. PATENT DOCUMENTS 5,091,334 A * 2/1992 Yamazaki et al. ........... 438/162
6,649,980 B2 * 11/2003 Noguchi .................... 257/351
6,919,238 B2 * 7/2005 Bohr ......................... 438/166

FOREIGN PATENT DOCUMENTS

| JP | 09-148426 | 6/1997 |
| KR | 10-0304713 | 7/2001 |
| KR | 1020030069407 A | 8/2003 |

* cited by examiner

*Primary Examiner*—Richard A. Booth
(74) *Attorney, Agent, or Firm*—Volentine & Whitt, PLLC

(57) ABSTRACT

A method of fabricating a semiconductor device includes forming an insulation layer structure on a single-crystalline silicon substrate, forming a first insulation layer structure pattern comprising a first opening by etching a portion of the insulation layer structure, filling the first opening with a non-single-crystalline silicon layer, and forming a single-crystalline silicon pattern by irradiating a first laser beam onto the non-single-crystalline silicon layer. The method also includes forming a second insulation layer structure pattern comprising a second opening by etching a portion of the first insulation layer structure, filling the second opening with a non-single-crystalline silicon-germanium layer, and forming a single-crystalline silicon-germanium pattern by irradiating a second laser beam onto the non-single-crystalline silicon-germanium layer.

20 Claims, 4 Drawing Sheets

METHOD FOR FABRICATING A SEMICONDUCTOR DEVICE

BACKGROUND OF THE INVENTION

1. Field of the Invention

Embodiments of the invention relate to methods for fabricating a semiconductor device. In particular, embodiments of the invention relate to methods for fabricating a semiconductor device comprising at least one of a complementary metal oxide semiconductor (CMOS) transistor and a silicon-on-insulator substrate.

This application claims priority to Korean Patent Application No. 2006-0030095, filed on Apr. 3, 2006, the subject matter of which is hereby incorporated by reference in its entirety.

2. Description of the Related Art

In general, a CMOS transistor has a structure comprising an N-channel metal oxide semiconductor (NMOS) transistor and a P-channel metal oxide semiconductor (PMOS) transistor. When a channel region of the NMOS transistor includes single-crystalline silicon, the NMOS transistor will have relatively good electrical performance. In addition, when a channel region of the PMOS transistor includes single-crystalline silicon-germanium, the PMOS transistor will have relatively good electrical performance.

Accordingly, there has been recent, active investigation into technology for fabricating a semiconductor device comprising an NMOS transistor and a PMOS transistor, wherein the NMOS transistor comprises a channel region including single-crystalline silicon and the PMOS transistor comprises a channel region including single-crystalline silicon-germanium. In addition, as the demand for finer patterns within the semiconductor device increases, the width of an isolation layer separating a region having the NMOS transistor from a region having the PMOS transistor is required to be less than about 50 nm.

However, using a conventional method, it is difficult to fabricate a semiconductor device that includes an isolation layer having a width of less than about 50 nm and also includes a channel region including single-crystalline silicon and another channel region including single-crystalline silicon-germanium.

SUMMARY OF THE INVENTION

Embodiments of the invention provide methods for fabricating a semiconductor device comprising an isolation layer having a width of less than about 50 nm, a first channel region comprising single-crystalline silicon, and a second channel region comprising single-crystalline silicon-germanium.

In one embodiment, the invention provides a method for fabricating a semiconductor device comprising forming an insulation layer structure on a single-crystalline silicon substrate having a first region and a second region, wherein the insulation layer structure comprises a plurality of layers having etch selectivities relative to one another; and forming a first insulation layer structure pattern by etching a portion of the insulation layer structure, wherein the first insulation layer structure pattern comprises a first opening exposing at least a portion of a surface of the first region. The method further comprises filling the first opening with a non-single-crystalline silicon layer; forming a single-crystalline silicon pattern by irradiating the non-single-crystalline silicon layer with a first laser beam; and forming a second insulation layer structure pattern by etching a portion of the first insulation layer structure, wherein the second insulation layer structure pattern comprises a second opening exposing a surface of the second region. The method still further comprises filling the second opening with a non-single-crystalline silicon-germanium layer; and forming a single-crystalline silicon-germanium pattern by irradiating the non-single-crystalline silicon-germanium layer with a second laser beam.

In another embodiment, the invention provides a method for fabricating a semiconductor device comprising a complementary metal oxide semiconductor (CMOS) transistor. The method comprises forming an insulation layer structure on a single-crystalline silicon substrate having a first region and a second region, wherein the insulation layer structure comprises a plurality of layers having etch selectivities relative to one another; and forming a first insulation layer structure pattern by etching a portion of the insulation layer structure, wherein the first insulation layer structure pattern comprises a first opening exposing at least a portion of a surface of the first region. The method further comprises filling the first opening with a non-single-crystalline silicon layer; forming a first channel region from a single-crystalline silicon pattern by irradiating the non-single-crystalline silicon layer with a first laser beam; and forming an isolation layer by forming a second insulation layer structure pattern by etching a portion of the first insulation layer structure, wherein the second insulation layer structure pattern comprises a second opening exposing a surface of the second region. The method still further comprises filling the second opening with a non-single-crystalline silicon-germanium layer; forming a second channel region from a single-crystalline silicon-germanium pattern formed by irradiating the non-single-crystalline silicon-germanium layer with a second laser beam; forming an N-channel metal oxide semiconductor (NMOS) transistor on the first channel region; and forming a P-channel metal oxide semiconductor (PMOS) transistor on the second channel region.

In yet another embodiment, the invention provides a method for fabricating a semiconductor device comprising a Silicon-On-Insulator substrate. The method comprises forming an insulation layer structure on a single-crystalline silicon substrate having a first region and a second region, wherein the insulation layer structure comprises a plurality of layers having etch selectivities relative to one another; and forming a first insulation layer structure pattern by etching a portion of the insulation layer structure, wherein the first insulation layer structure pattern comprises a first opening exposing at least a portion of a surface of the first region. The method further comprises filling the first opening with a non-single-crystalline silicon layer; forming a P-well from a single-crystalline silicon pattern formed by irradiating the non-single-crystalline silicon layer with a first laser beam; and forming a second insulation layer structure pattern by etching a portion of the first insulation layer structure, wherein the second insulation layer structure pattern comprises a second opening exposing a surface of the second region. The method still further comprises filling the second opening with a non-single-crystalline silicon-germanium layer; forming an N-well from a single-crystalline silicon-germanium pattern formed by irradiating the non-single-crystalline silicon-germanium layer with a second laser beam; forming a first plug on the P-well; forming a second plug on the N-well; and forming a first channel region and a second channel region on the single-crystalline silicon substrate.

In addition, in accordance with embodiments of the invention, the width of an isolation layer may be readily controllable, so a semiconductor device comprising an isolation layer having a width of less than about 50 nm, and further comprising a first channel region comprising single-crystalline silicon and a second channel region comprising single-crystalline silicon-germanium, may be readily fabricated.

BRIEF DESCRIPTION OF THE DRAWINGS

Embodiments of the-invention will be described herein with reference to the accompanying drawings, in which.

FIGS. (FIGS.) 1A to 1I are cross-sectional views illustrating a method for fabricating a semiconductor device in accordance with an embodiment of the invention.

DESCRIPTION OF EMBODIMENTS

Figure 1A:
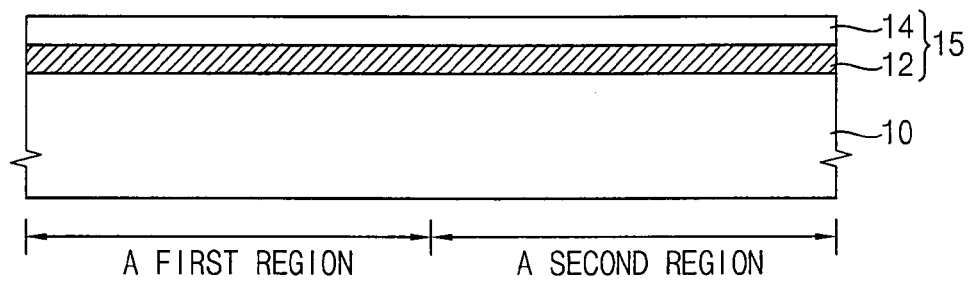

In the drawings, the sizes of layers and regions are not necessarily drawn to scale, and like reference symbols refer to like or similar elements throughout.

As used herein, when a first element or layer is referred to as being "on" or "connected to" a second element or layer, the first element or layer may be directly on or directly connected to the second element or layer or intervening elements or layers may be present. In contrast, when a first element is referred to as being "directly on," or "directly connected to" a second element or layer, there are no intervening elements or layers present. As used herein, the term "and/or" includes any combination of one or more of the associated listed items.

In addition, although terms such as "first," and "second," may be used herein to describe various elements, components, regions, layers, and/or sections, those elements, components, regions, layers and/or sections should not be limited by those terms. Those terms are used only to distinguish one element, component, region, layer, or section from another. Thus, a first element, component, region, layer, or section discussed below could be called a second element, component, region, layer, or section without departing from the scope of the invention as defined by the accompanying claims.

Spatially relative terms such as "beneath," "below," "lower," "above," "upper" and the like may be used herein to describe one element or feature's relationship to another element(s) or feature(s), as illustrated in the accompanying drawings. However, the spatially relative terms are intended to encompass different orientations of the device in use or operation in addition to the orientation depicted in the drawings. For example, if a device in the drawings is turned over, elements described as "below" or "beneath" other elements or features would then be oriented "above" the other elements or features. Thus, the term "below" can encompass both an orientation of above and below. In addition, the device may be otherwise oriented (e.g., rotated 90 degrees) and the spatially relative terms used herein are to be interpreted accordingly.

Embodiments of the invention are described herein with reference to cross-sectional illustrations that are schematic illustrations of idealized embodiments of the invention and idealized intermediate structures for embodiments of the invention. As such, variations from the shapes illustrated in the drawings as a result of, for example, fabrication techniques and/or tolerances are to be expected. Thus, embodiments of the invention should not be construed as limited to the particular shapes of regions illustrated herein but are to include deviations in shapes that result from, for example, fabrication techniques and/or tolerances. For example, an implanted region illustrated as a rectangle will typically have rounded or curved features and/or a gradient of implant concentration at its edges rather than a binary change from an implanted to a non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shapes of regions and are not intended to limit the scope of the invention.

FIGS. 1A to 1I are cross-sectional views illustrating a method for fabricating a semiconductor device in accordance with an embodiment of the invention.

Referring to FIG. 1A, a single-crystalline silicon substrate 10 has (i.e., is divided into) a first region and a second region. In particular, when a complementary metal oxide semiconductor (CMOS) transistor is to be formed on the single-crystalline silicon substrate 10 in order to form a semiconductor device, the first region corresponds to a region where an N-channel metal oxide semiconductor (NMOS) transistor will be formed and the second region corresponds to a region where a P-channel metal oxide semiconductor (PMOS) transistor will be formed. An insulation layer structure 15 comprising a plurality of layers is formed on the single-crystalline silicon substrate 10, wherein the layers of the plurality of layers have etch selectivities relative to one another. The insulation layer structure 15 may comprise a silicon nitride layer and a silicon oxide layer, wherein the silicon nitride layer and the silicon oxide layer have etch selectivities relative to one another. In the embodiment illustrated in FIGS. 1A to 1I, a silicon nitride layer 12 and a silicon oxide layer 14 are sequentially formed as the insulation layer structure 15 on the single-crystalline silicon substrate 10. The silicon nitride layer 12 and the silicon oxide layer 14 are formed to a thickness sufficient for an insulation layer formed from them to isolate neighboring active regions of the single-crystalline silicon substrate 10. Therefore, when an isolation layer is formed from the insulation layer structure 15 (see, e.g., an isolation layer 280 of FIG. 1I), the insulation layer structure 15 may have a thickness sufficient to isolate neighboring active regions of a substrate. When a buried isolation layer of a silicon-on-insulator substrate (see, e.g., FIG. 3) is formed from the insulation layer structure 15, the insulation layer structure 15 may be formed having a thickness sufficient for the buried isolation layer formed from the insulation layer structure 15 to isolate neighboring buried regions of the silicon-on-insulator substrate.

Figure 1B:
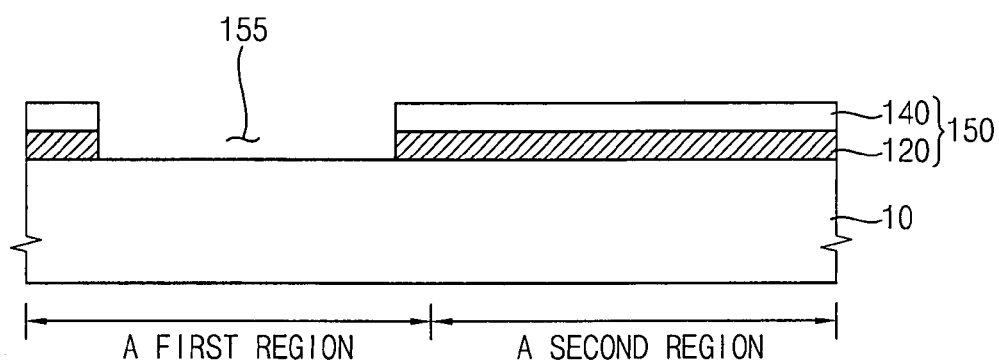

Referring to FIG. 1B, a first insulation layer structure pattern 150 having a first opening 155 partially exposing a surface of the single crystalline silicon substrate 10 is formed on the single crystalline silicon substrate 10. The first insulation layer structure pattern 150 is formed by etching a portion of the isolation layer structure 15 disposed on the first region. The silicon oxidation layer 14 and the silicon nitride layer 12 have etch selectivities relative to one another, and the first opening 155 is formed by etching a portion of each of the silicon oxidation layer 14 and the silicon nitride layer 12. In the embodiment illustrated in FIGS. 1A to 1I, the first insulation layer structure pattern 150 comprising a silicon oxide layer pattern 140 and a silicon nitride layer pattern 120 is formed by sequentially etching a portion of each of the silicon oxide layer 14 and the silicon nitride layer 12, wherein each of those portions is disposed on the first region, through an etching process exploiting the relative etch selectivities between the silicon oxide layer 14 and the silicon nitride layer 12. That is, the respective portions of the silicon oxide layer 14 and the silicon nitride layer 12 that are etched are etched through a process that takes advantage of (i.e., uses) the relative etch selectivities between the silicon oxide layer 14 and the silicon nitride layer 12.

Figure 1C:
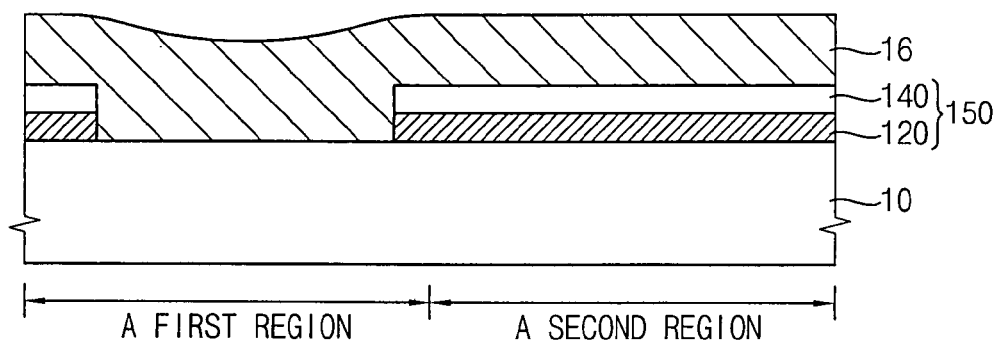

Referring to FIG. 1C, a non-single-crystalline silicon layer 16 is formed on the single-crystalline silicon substrate 10 and the first insulation layer structure pattern 150, and fills the first opening 155. A non-single-crystalline silicon layer 16 may comprise amorphous silicon or poly-crystalline silicon. The non-single-crystalline silicon layer 16 may be formed through a chemical vapor deposition (CVD) process using a source gas such as $SiH_4$ or $Si_2H_6$.

In addition, the non-single-crystalline silicon layer 16 may be doped with impurities when it is formed. In particular, because the non-single-crystalline silicon layer 16 defines a channel region of an NMOS transistor that may be formed subsequently, it may be advantageous to dope the non-single-crystalline silicon layer 16 with P-type impurities. Boron is an example of a P-type impurity.

The non-single-crystalline silicon layer 16 may be doped with impurities through an in-situ doping process at the same time as the non-single-crystalline silicon layer 16 is being formed on the substrate 10 and the first insulation layer structure pattern 150. Alternatively, the non-single-crystalline silicon layer 16 may be doped with impurities through an ion implantation process after the non-single-crystalline silicon layer 16 is formed.

In accordance with an embodiment of the invention, the non-crystalline silicon layer 16 may comprise carbon when it is formed. In a subsequent process, the non-single-crystalline silicon layer 16 is changed into a single-crystalline silicon pattern, which may serve as a channel region for a subsequently formed NMOS transistor or a P-well for a silicon-on-insulator substrate. An advantage of the single-crystalline silicon pattern comprising carbon is that the single-crystalline silicon pattern will have relatively good electrical performance.

When the non-single-crystalline silicon layer 16 comprises carbon, the non-single-crystalline silicon layer 16 is formed through a CVD process using a source gas such as $SiH_4$, $Si_2H_6$, etc., and an additional source gas comprising carbon. The additional source gas comprising carbon may be, for example, a hydrocarbon compound, a carbon oxide compound, etc. Methane, ethane, propane, butane, ethylene, propylene, acetylene, etc., are examples of the hydrocarbon compound, and carbon dioxide, carbon monoxide, etc., are examples of the carbon oxide compound.

Figure 1D:
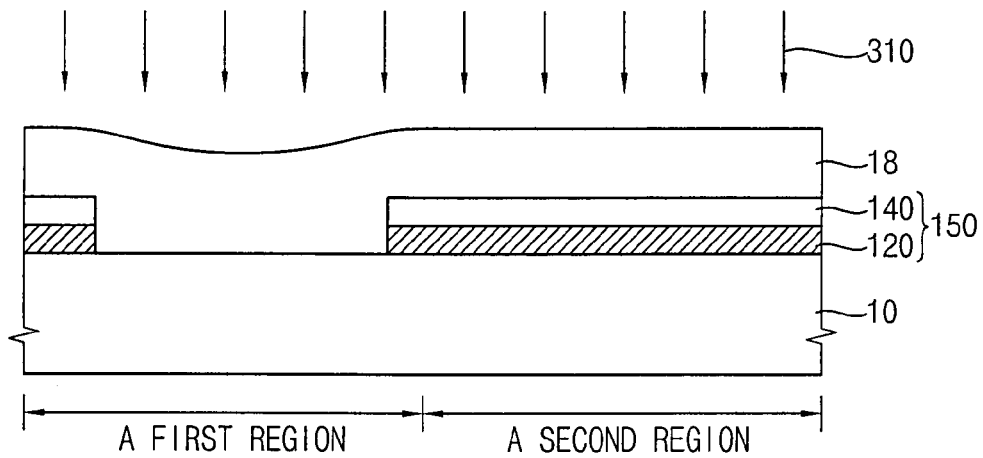

Referring to FIG. 1D, a laser beam 310 is irradiated onto the non-single-crystalline silicon layer 16. In particular, the laser beam 310 is irradiated onto the non-single-crystalline silicon layer 16 in order to cause a phase change in the non-single-crystalline silicon layer 16. As the laser beam 310 is irradiated onto the non-single-crystalline silicon layer 16, the non-single-crystalline silicon layer 16 is transformed from a solid to a liquid (i.e., from a solid phase to a liquid phase). Therefore, the laser beam 310 is irradiated onto the non-single-crystalline silicon layer 16 with an intensity sufficient to melt the non-single-crystalline silicon layer 16. Because a melting point of the non-single-crystalline silicon layer 16 is about 1410° C., the temperature of the non-single-crystalline silicon layer 16 is maintained higher than about 1410° C. by continuously irradiating the laser beam 310 onto the non-single-crystalline silicon layer 16.

The non-single-crystalline silicon layer 16 is transformed from a solid to a liquid by irradiating the laser beam 310 onto the non-single-crystalline silicon layer 16. The non-single-crystalline silicon layer 16 is transformed from a solid to a liquid progressively beginning at a surface of the non-single-crystalline silicon layer 16 and progressing through to an interface between the non-single-crystalline silicon layer 16 and a portion of the single-crystalline silicon substrate 10 exposed by the first opening 155. Thereafter, the single-crystalline silicon substrate 10 exposed by the first opening 155 functions as a crystallization seed for the non-single-crystalline silicon layer 16, which has been changed into a liquid. As a result, a crystal structure of the non-single-crystalline silicon layer 16 is changed into a single-crystal structure.

Therefore, in accordance with an embodiment of the invention, the non-single-crystalline silicon layer 16 is changed into a single-crystalline silicon layer 18 disposed on the first region of the single-crystalline silicon substrate 10 by irradiating the laser beam 310 onto the non-single-crystalline silicon layer 16 and using the single-crystalline silicon substrate 10 as a crystallization seed.

The phase change and the crystal-structural change of the non-single-crystalline silicon layer 16 occurs in only a few nanoseconds to substantially prevent the non-single-crystalline silicon layer 16, once it has been transformed into a liquid, from flowing off of the single-crystalline silicon substrate 10. In accordance with an embodiment of the invention, the laser beam 310 may comprise a gas laser such as an excimer laser. A system for irradiating the laser beam 310 advantageously comprises an illumination unit that may be operated in a scan mode in order to complete the irradiation of the laser beam 310 onto the non-single-crystalline silicon layer 16 in a relatively short amount of time.

In addition, the single-crystalline silicon substrate 10 may be heated while the laser beam 310 is irradiated onto the non-single-crystalline silicon layer 16. When the phase change of the non-single-crystalline silicon layer 16 is caused by the irradiation of the laser beam 310, heating the single-crystalline silicon substrate 10 while the laser beam 310 is irradiated onto the non-single-crystalline silicon layer 16 reduces a temperature gradient of the non-single-crystalline silicon layer 16. Therefore, in accordance with an embodiment of the invention, when the laser beam 310 is irradiated onto the non-single-crystalline silicon layer 16, the single-crystalline silicon substrate 10 is heated up to a temperature of about 400° C.

Figure 1E:
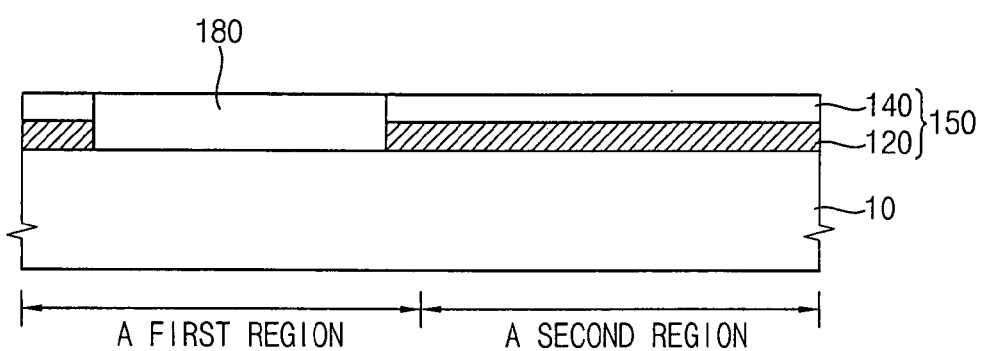

Referring to FIG. 1E, the single-crystalline silicon layer 18 is planarized. A planarization of the single-crystalline silicon layer 18 is performed until the surface of the first insulation layer structure pattern 150 is exposed. The planarization of the single-crystalline silicon layer 18 may be performed through a chemical mechanical polishing (CMP) process or an etch-back process.

By planarizing the single-crystalline silicon layer 18 until the surface of the first insulation layer structure pattern 150 is exposed, a single-crystalline silicon pattern 180 is given a plug structure that fills the first opening 155. Thus, the single-crystalline silicon pattern 180 is formed on the first region of the single-crystalline silicon substrate 10.

In accordance with an embodiment of the invention, the single-crystalline silicon pattern 180 is formed by planarizing the single-crystalline silicon layer 18 after the single-crystalline silicon layer 18 has been formed from the non-single crystalline silicon layer 16. In accordance with another embodiment of the invention, after the non-single-crystalline silicon layer 16 has been formed on the single-crystalline silicon substrate 10 and the first insulation layer structure pattern 150, the non-single-crystalline silicon layer 16 is planarized, and then the single-crystalline silicon pattern 180 is formed by irradiating the laser beam 310 onto the planarized non-single-crystalline silicon layer 16.

In accordance with embodiments of the invention, the single-crystalline silicon pattern 180 is formed from the non-single-crystalline silicon layer 16 by irradiating the laser beam 310 onto the non-single-crystalline silicon layer 16 and using the single-crystalline silicon substrate 10 as a crystallization seed in order to substantially prevent defects from being generated at an interface between the single-crystalline silicon pattern 180 and the single-crystalline silicon substrate 10. Therefore, a single-crystalline silicon pattern 180 of relatively higher quality may be formed.

Figure 1F:
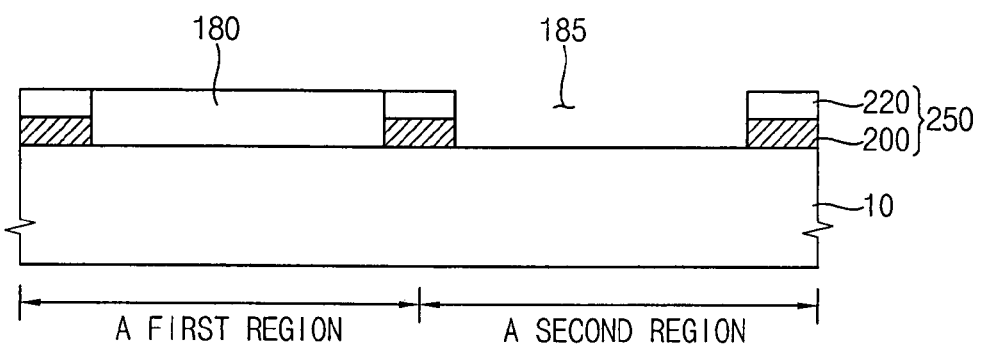

Referring to FIG. 1F, after forming the single-crystalline silicon pattern 180 filling the first opening 155, a second insulation layer structure pattern 250 having a second opening 185 exposing a surface of the second region of the single-crystalline silicon substrate 10 is formed by partially etching the first insulation layer structure pattern 150. A method for forming the second insulation layer structure pattern 250 is substantially the same as the method for forming the first insulation layer structure pattern 150 described with reference to FIG. 1B. Thus, the second insulation layer structure pattern 250 is formed through an etching process that exploits the relative etch selectivities between the silicon oxide layer pattern 140 and the silicon nitride layer pattern 120 (i.e., between a silicon oxide layer and a silicon nitride layer). The second insulation layer structure pattern 250 comprises a silicon oxide layer pattern 220 and a silicon nitride layer pattern 200.

Figure 1G:
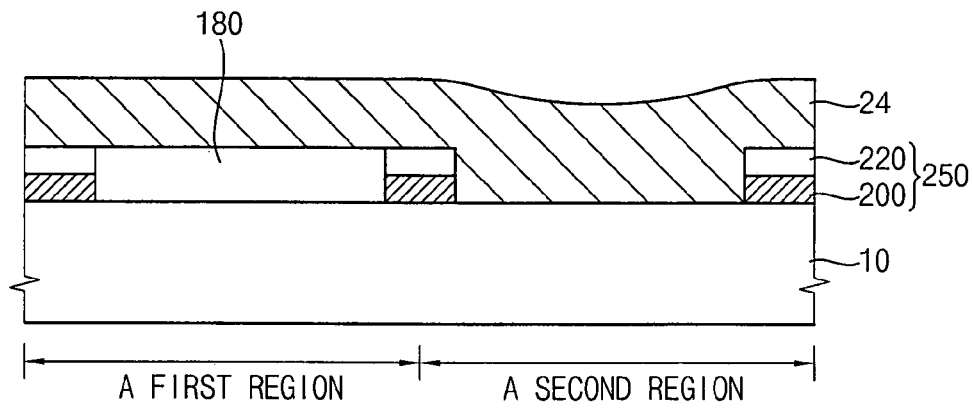

Referring to FIG. 1G, a non-single-crystalline silicon-germanium layer 24 is formed on the single-crystalline silicon substrate 10, the single-crystalline silicon pattern 180, and the second insulation layer structure pattern 250. The non-single-crystalline silicon-germanium layer 24 fills the second opening 185. The non-single-crystalline silicon-germanium layer 24 may comprise an amorphous silicon-germanium layer or a poly-crystalline silicon-germanium layer. Thus, the non-single-crystalline silicon-germanium layer 24 may be formed through a CVD process using a silicon source gas and a germanium source gas. Silane ($SiH_4$), disilane ($Si_2H_6$), etc., are examples of the silicon source gas, and germane ($GeH_4$), germanium tetraflouride ($GeF_4$), etc., are examples of the germanium source gas.

The non-single-crystalline silicon-germanium layer 24 may be doped with impurities when it is formed. In particular, because the non-single-crystalline silicon layer 24 defines the channel region of a PMOS transistor that may be formed subsequently, it may be advantageous to dope the non-single-crystalline silicon layer 24 with N-type impurities. Phosphorus, arsenic, etc., are examples of an N-type impurity.

The non-single-crystalline silicon-germanium layer 24 may be doped with impurities through an in-situ doping process at the same time as the non-single-crystalline silicon-germanium layer 24 is being formed on the substrate 10, the single-crystalline silicon pattern 180, and the second insulation layer structure pattern 250. Alternatively, the non-single-crystalline silicon-germanium layer 24 may be doped with impurities through an ion implantation process after the non-single-crystalline silicon-germanium layer 24 is formed.

In accordance with an embodiment of the invention, the non-single-crystalline silicon-germanium layer 24 may comprise carbon when it is formed. In a subsequent process, the non-single-crystalline silicon-germanium layer 24 is changed into a single-crystalline silicon-germanium pattern, which may serve as a channel region for a subsequently formed PMOS transistor or an N-well for a silicon-on-insulator substrate. A method for forming the non-single-crystalline silicon-germanium layer 24 comprising carbon is substantially the same as the method for forming the non-single-crystalline silicon layer 16 comprising carbon described previously.

Figure 1H:
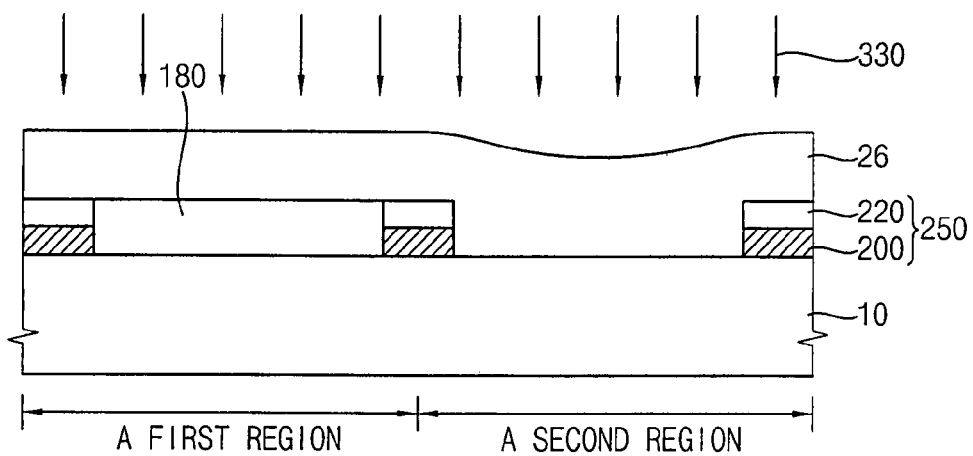

Referring to FIG. 1H, a laser beam 330 is irradiated onto the non-single-crystalline silicon-germanium layer 24. A method for irradiating the laser beam 330 onto the non-single-crystalline silicon-germanium layer 24 is substantially the same as the corresponding method described with reference to FIG. 1D, except for controlling an intensity of the laser beam 330. The intensity of the laser beam 330 irradiated onto the non-single-crystalline silicon-germanium layer 24 is controlled in order to adjust the germanium content of the non-single-crystalline silicon-germanium layer 24.

In accordance with an embodiment of the invention, the non-single-crystalline silicon-germanium layer 24 is changed into a single-crystalline silicon-germanium layer 26 having a single-crystal structure disposed on the second region of the single-crystalline silicon substrate 10 by irradiating the laser beam 330 onto the non-single-crystalline silicon-germanium layer 24 to change the phase of the non-single-crystalline silicon-germanium layer 24 and using the single-crystalline silicon substrate 10 as a crystallization seed.

Figure 1I:
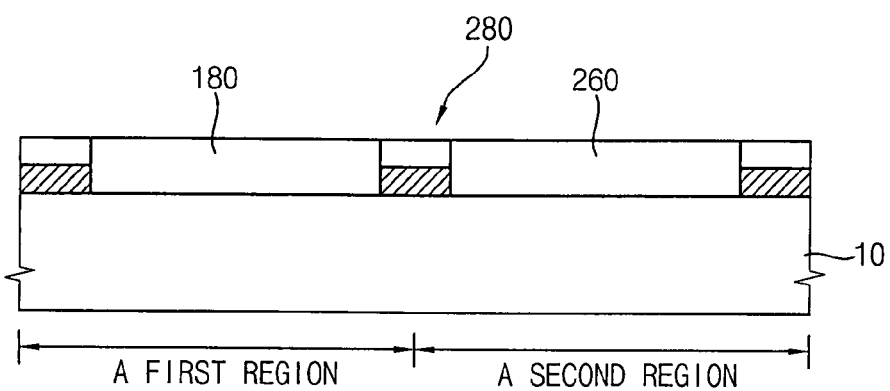

Referring to FIG. 1I, the single-crystalline silicon-germanium layer 26 is planarized. One method for planarizing the single-crystalline silicon-germanium layer 26 is substantially similar to the method used to planarize the single-crystalline silicon layer 18 described above.

Accordingly, by planarizing the single-crystalline silicon-germanium layer 26, a single-crystalline silicon-germanium pattern 260 having a plug structure and filling the second opening 185 is formed. Therefore, the single-crystalline silicon-germanium pattern 260 is formed on the second region of the single-crystalline silicon substrate 10.

In accordance with an embodiment of the invention, the single-crystalline silicon-germanium pattern 260 is formed by planarizing the single-crystalline silicon-germanium layer 26 after the single-crystalline silicon-germanium layer 26 is formed from the non-single crystalline silicon-germanium layer 24. In accordance with another embodiment of the invention, after forming the non-single-crystalline silicon-germanium layer 24 on the single-crystalline silicon substrate 10, the single-crystalline silicon pattern 180, and the second insulation layer structure pattern 250 and planarizing the non-single-crystalline silicon-germanium layer 24, the single-crystalline silicon pattern 260 is formed by irradiating the laser beam 310 onto the non-single-crystalline silicon-germanium layer 24, which has previously been planarized.

In accordance with embodiments of the invention, the single-crystalline silicon-germanium pattern 260 is formed from the non-single-crystalline silicon-germanium layer 24 by irradiating the laser beam 310 onto the non-single-crystalline silicon-germanium layer 24 and using the single-crystalline silicon substrate 10 as a crystallization seed in order to substantially prevent defects from being generated at an interface between the single-crystalline silicon-germanium pattern 180 and the single-crystalline silicon substrate 10. Therefore, a single-crystalline silicon-germanium pattern 260 of relatively higher quality may be formed.

In accordance with embodiments of the invention, the single-crystalline silicon pattern 180 may be formed on the first region of the single-crystalline silicon substrate 10, and the single-crystalline silicon-germanium pattern 260 may be formed on the second region of the single-crystalline silicon substrate 10. In particular, the single-crystalline silicon pattern 180 may serve as a channel region for a subsequently formed NMOS transistor or a P-well for a silicon-on-insulator substrate. In addition, the single-crystalline silicon-germanium pattern 260 may serve as a channel region for a subsequently formed PMOS transistor or an N-well for a silicon-on-insulator substrate. After the single-crystalline silicon pattern 180 and the single-crystalline silicon-germanium pattern 260 are formed, a portion of the second insulation layer structure pattern 250 remaining between the single-crystalline silicon pattern 180 and the single-crystalline silicon-germanium pattern 260 (which is also a remaining portion of the first insulation layer structure pattern 150), may serve as an isolation layer 280. In addition, a width of the isolation layer 280 may be readily controllable. For example, the isolation layer 280, which is a portion of the second insulation layer structure pattern 250 (and the first insulation layer structure pattern 150) remaining between the single-crystalline silicon pattern 180 and the single-crystalline silicon-germanium pattern 260, may have a width of less than about 50 nm.

Thus, in accordance with embodiments of the invention, a semiconductor device comprising an isolation layer 280 formed on the single silicon substrate 10 and having a width of less than about 50 nm, and further comprising a first channel region comprising the single-crystalline silicon pattern 180 and a second channel region comprising the single-crystalline silicon-germanium pattern 260 may be readily fabricated.

Figure 2:
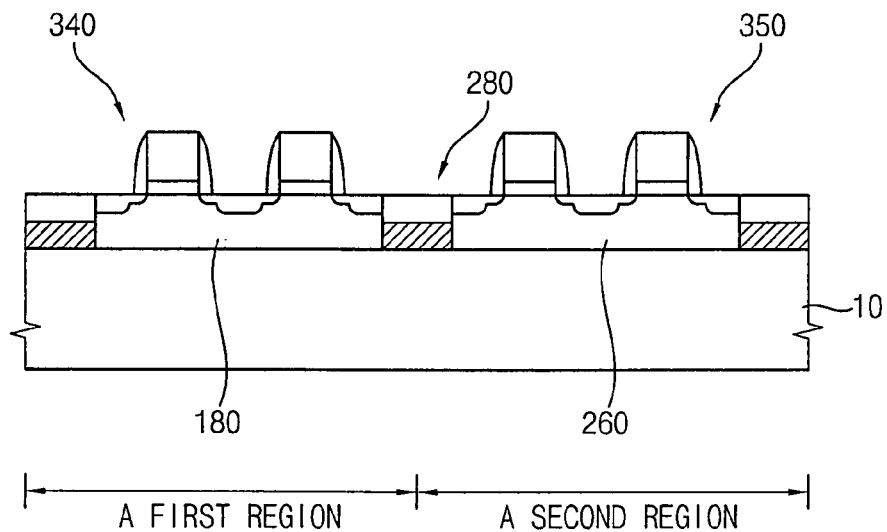
FIG. 2 is a cross-sectional view illustrating a semiconductor device comprising a CMOS transistor, wherein the semiconductor device is fabricated using a method in accordance with an embodiment of the invention described with reference to FIGS. 1A to 1I.

FIG. 2 is a cross-sectional view illustrating a semiconductor device comprising a CMOS transistor, wherein the semiconductor device is fabricated using a method in accordance with an embodiment of the invention described with reference to FIGS. 1A to 1I. In FIGS. 1A to 1I and FIG. 2, like reference symbols refer to like or similar elements.

Processes substantially the same as those described with reference to FIGS. 1A to 1I are performed in order to form a single-crystalline silicon pattern, a single-crystalline silicon-germanium pattern, and an isolation layer on a single-crystalline silicon substrate 10. The single-crystalline silicon pattern serves as a channel region 180 for an NMOS transistor disposed in a first region of the silicon substrate 10. The single-crystalline silicon-germanium pattern serves as a channel region 260 for a PMOS transistor disposed in a second region of the silicon substrate 10. The isolation layer is formed between the channel region 180 and the channel region 260.

Referring to FIG. 2, an NMOS transistor 340 comprising a gate pattern and source/drain regions is formed on a single-crystalline silicon pattern that is channel region 180 for an NMOS transistor. A PMOS transistor 350 comprising a gate pattern and source/drain regions is formed on a single-crystalline silicon-germanium pattern that is channel region 260 for a PMOS transistor.

In accordance with at least one embodiment of the invention, a CMOS transistor comprising an isolation layer 280 having a width of less than about 50 nm, and comprising an NMOS transistor 340 and a PMOS transistor 350, which each have relatively good electrical characteristics, may be readily fabricated.

Figure 3:
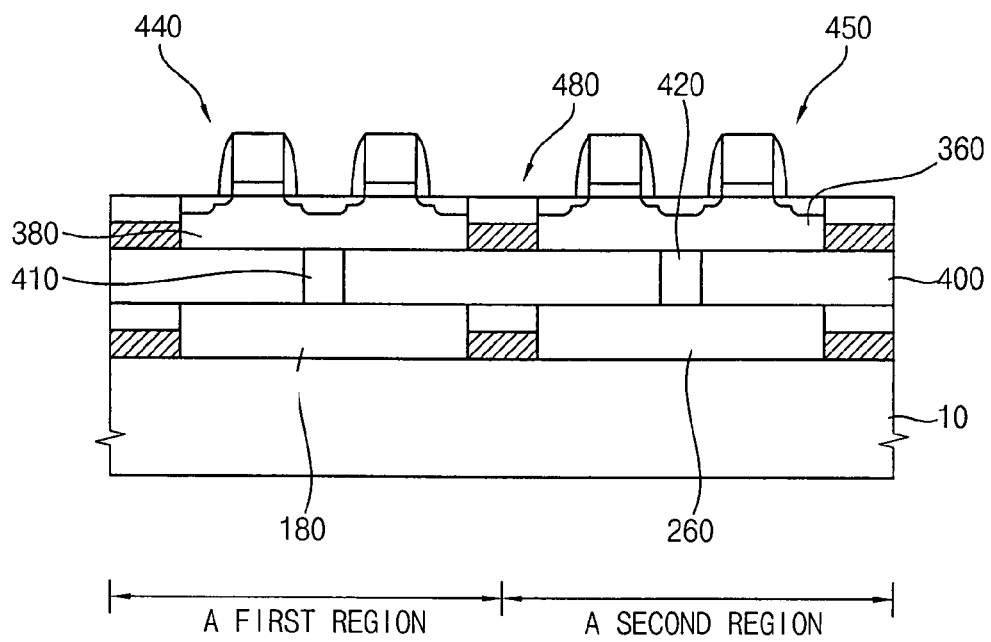
FIG. 3 is a cross-sectional view illustrating a semiconductor device comprising a silicon-on-insulator substrate fabricated using a method in accordance with an embodiment of the invention described with reference to FIGS. 1A to 1I.

FIG. 3 is a cross-sectional view illustrating a semiconductor device comprising a silicon-on-insulator substrate fabricated using a method in accordance with an embodiment of the invention described with reference to FIGS. 1A to 1I. In FIGS. 1A to 1I and FIG. 3, like reference symbols indicate like or similar elements.

Processes that are substantially the same as those described with reference to FIGS. 1A to 1I are performed in order to form a single-crystalline silicon pattern and a single-crystalline silicon-germanium pattern on a single-crystalline silicon substrate 10. The single-crystalline silicon pattern is disposed on a first region of the single-crystalline silicon substrate 10 and serves as a P-well 180 for a silicon-on-insulator substrate. The single-crystalline silicon-germanium pattern is disposed on a second region of the silicon substrate 10 and serves as an N-well 260 for the silicon-on-insulator substrate.

Referring to FIG. 3, a plug 410, a plug 420, and a buried insulation layer 400 are formed on the single-crystalline silicon substrate 10 on which P-well 180 and N-well 260 have been formed (i.e., after P-well 180 and N-well 260 have been formed). In particular, plug 410 is formed on P-well 180 and plug 420 is formed on N-well 260. In addition, a single-crystalline silicon pattern that serves as a channel region 380 for an NMOS transistor and a single-crystalline silicon-germanium pattern that serves as a channel region 360 for a PMOS transistor are formed on buried insulation layer 400. An isolation layer 480 is formed between the channel region 380 for an NMOS transistor and the channel region 360 for a PMOS transistor. Thus, the channel region 380 for an NMOS transistor is formed on the first region of single-crystalline silicon substrate 10, and the channel region 360 for a PMOS transistor is formed on the second region of the single-crystalline silicon substrate 10.

The channel region 380 for an NMOS transistor and the channel region 360 for a PMOS transistor are formed through a method that is substantially the same as a method described with reference to previously described embodiments and FIGS. 1A to 1I. In particular, the single-crystalline silicon pattern that serves as the channel region 380 for an NMOS transistor is formed using the plug 410 as a crystallization seed. In addition, the plug 410 is electrically connected to the single-crystalline silicon pattern that serves as P-well 180. The single-crystalline germanium pattern that serves as the channel region 360 for a PMOS transistor is formed using a plug 420 as a crystallization seed. In addition, the plug 420 is electrically connected to the single-crystalline silicon-germanium pattern that serves as N-well 260.

By performing processes that are substantially the same as the processes described with reference to FIG. 2, an NMOS transistor 440 comprising a gate pattern and source/drain regions is formed on the single-crystalline silicon pattern that is the channel region 380 for an NMOS transistor, and a PMOS transistor 450 comprising a gate pattern and source/drain regions is formed on the single-crystalline silicon-germanium pattern that is the channel region 360 for a PMOS transistor.

Therefore, in accordance with at least one embodiment of the invention, a semiconductor device comprising a silicon-on-insulator substrate and having relatively good electrical performance may be readily fabricated.

In accordance with embodiments of the invention, a semiconductor device comprising a single-crystalline silicon pattern as a channel region for an NMOS transistor, a single-crystalline silicon-germanium pattern as a channel region for a PMOS transistor, and an isolation layer having a width of less than about 50 nm may be readily fabricated. In particular, in accordance with embodiments of the invention, because the single-crystalline silicon pattern and the single-crystalline silicon-germanium pattern are formed by changing a crystal structure through the irradiation of at least one laser beam, crystal defects in channel regions for NMOS and PMOS transistors may be substantially prevented.

Thus, when fabricating a semiconductor device in accordance with an embodiment of the invention, reliability of the semiconductor device may improve and the productivity of a related manufacturing process for such semiconductor devices may improve.

In addition, one or more embodiments of the invention may have various fields of application such as in a silicon-on-insulator substrate as well as in forming a channel region.

Although embodiments of the invention have been described herein, modifications may be made to those embodiments by those skilled in the art without departing from the scope of the invention as defined by the accompanying claims.

What is claimed is:

1. A method for fabricating a semiconductor device comprising:
   forming an insulation layer structure on a single-crystalline silicon substrate having a first region and a second region, wherein the insulation layer structure comprises a plurality of layers having etch selectivities relative to one another;
   forming a first insulation layer structure pattern by etching a portion of the insulation layer structure, wherein the first insulation layer structure pattern comprises a first opening exposing at least a portion of a surface of the first region;
   filling the first opening with a non-single-crystalline silicon layer;
   forming a single-crystalline silicon pattern by irradiating the non-single-crystalline silicon layer with a first laser beam;
   forming a second insulation layer structure pattern by etching a portion of the first insulation layer structure, wherein the second insulation layer structure pattern comprises a second opening exposing a surface of the second region;
   filling the second opening with a non-single-crystalline silicon-germanium layer; and
   forming a single-crystalline silicon-germanium pattern by irradiating the non-single-crystalline silicon-germanium layer with a second laser beam.

2. The method of claim 1, further comprising:
   doping the non-single-crystalline silicon layer with P-type impurities; and
   doping the non-single-crystalline silicon-germanium layer with N-type impurities.

3. The method of claim 2, wherein doping the non-single-crystalline silicon layer with P-type impurities comprises:
   performing an in-situ doping process at substantially the same time as filling the first opening with the non-single-crystalline silicon layer is performed; or
   performing an ion implantation process after filling the first opening with the non-single-crystalline silicon layer.

4. The method of claim 2, wherein doping the non-single-crystalline silicon-germanium layer with N-type impurities comprises:
   performing an in-situ doping process at substantially the same time as filling the second opening with the non-single-crystalline silicon-germanium layer is performed; or
   performing an ion implantation process after filling the second opening with the non-single-crystalline silicon-germanium layer.

5. The method of claim 1, wherein:
   irradiating the non-single-crystalline silicon layer with the first laser beam comprises irradiating the first laser beam with an intensity sufficient to melt the non-single-crystalline silicon layer; and
   irradiating the non-single-crystalline silicon-germanium layer with the second laser beam comprises irradiating the second laser beam with an intensity sufficient to melt the non-single germanium-silicon layer.

6. The method of claim 1, wherein:
   irradiating the non-single-crystalline silicon layer with the first laser beam forms a single-crystalline silicon layer from the non-single-crystalline silicon layer;
   forming the single-crystalline silicon pattern further comprises planarizing the single-crystal silicon layer;
   irradiating the non-single-crystalline silicon-germanium layer with the second laser beam forms a single-crystalline silicon-germanium layer from the non-single-crystalline silicon-germanium layer; and
   forming the single-crystalline silicon-germanium pattern further comprises planarizing the single-crystal silicon-germanium layer.

7. The method of claim 1, wherein:
   filling the first opening with the non-single-crystalline silicon layer comprises:
     forming a non-single-crystalline silicon layer on the single-crystalline silicon substrate after forming the first insulation layer structure pattern; and
     planarizing the non-single-crystalline silicon layer until a surface of the first insulation layer structure pattern is exposed, and
   filling the second opening with the non-single-crystalline silicon-germanium layer comprises:
     forming a non-single-crystalline silicon-germanium layer on the single-crystalline silicon substrate after forming the second insulation layer structure pattern; and
     planarizing the non-single-crystalline silicon-germanium layer until a surface of the second insulation layer structure pattern is exposed.

8. The method of claim 1, wherein the non-single-crystalline silicon layer and the non-single-crystalline silicon-germanium layer each comprise carbon.

9. A method for fabricating a semiconductor device comprising a complementary metal oxide semiconductor (CMOS) transistor, the method comprising:
   forming an insulation layer structure on a single-crystalline silicon substrate having a first region and a second region, wherein the insulation layer structure comprises a plurality of layers having etch selectivities relative to one another;
   forming a first insulation layer structure pattern by etching a portion of the insulation layer structure, wherein the first insulation layer structure pattern comprises a first opening exposing at least a portion of a surface of the first region;
   filling the first opening with a non-single-crystalline silicon layer;
   forming a first channel region from a single-crystalline silicon pattern formed by irradiating the non-single-crystalline silicon layer with a first laser beam;
   forming an isolation layer from a second insulation layer structure pattern by etching a portion of the first insulation layer structure, wherein the second insulation layer structure pattern comprises a second opening exposing a surface of the second region;

filling the second opening with a non-single-crystalline silicon-germanium layer;
forming a second channel region from a single-crystalline silicon-germanium pattern formed by irradiating the single-crystalline silicon-germanium pattern with a second laser beam;
forming an N-channel metal oxide semiconductor (NMOS) transistor on the first channel region; and
forming a P-channel metal oxide semiconductor (PMOS) transistor on the second channel region.

10. The method of claim 9, further comprising:
doping the non-single-crystalline silicon layer with P-type impurities; and
doping the non-single-crystalline silicon-germanium layer with N-type impurities.

11. The method of claim 10, wherein doping the non-single-crystalline silicon layer with P-type impurities comprises:
performing an in-situ doping process at substantially the same time as filling the first opening with the non-single-crystalline silicon layer is performed; or
performing an ion implantation process after filling the first opening with the non-single-crystalline silicon layer.

12. The method of claim 10, wherein doping the non-single-crystalline silicon-germanium layer with N-type impurities comprises:
performing an in-situ doping process at substantially the same time as filling the second opening with the non-single-crystalline silicon-germanium layer is performed; or
performing an ion implantation process after filling the second opening with the non-single-crystalline silicon-germanium layer.

13. The method of claim 9, wherein:
irradiating the non-single-crystalline silicon layer with the first laser beam comprises irradiating the first laser beam with an intensity sufficient to melt the non-single-crystalline silicon layer; and
irradiating the non-single-crystalline silicon-germanium layer with the second laser beam comprises irradiating the second laser beam with an intensity sufficient to melt the non-single germanium-silicon layer.

14. The method of claim 9, wherein:
irradiating the non-single-crystalline silicon layer with the first laser beam forms a single-crystalline silicon layer from the non-single-crystalline silicon layer;
forming the single-crystalline silicon pattern further comprises planarizing the single-crystal silicon layer;
irradiating the non-single-crystalline silicon-germanium layer with the second laser beam forms a single-crystalline silicon-germanium layer from the non-single-crystalline silicon-germanium layer; and
forming the single-crystalline silicon-germanium pattern further comprises planarizing the single-crystal silicon-germanium layer.

15. The method of claim 9, wherein:
filling the first opening with the non-single-crystalline silicon layer comprises:
forming a non-single-crystalline silicon layer on the single-crystalline silicon substrate after forming the first insulation layer structure pattern; and,
planarizing the non-single-crystalline silicon layer until a surface of the first insulation layer structure pattern is exposed, and filling the second opening with the non-single-crystalline silicon-germanium layer comprises:
forming a non-single-crystalline silicon-germanium layer on the single-crystalline silicon substrate after forming the second insulation layer structure pattern; and
planarizing the non-single-crystalline silicon-germanium layer until a surface of the second insulation layer structure pattern is exposed.

16. A method for fabricating a semiconductor device comprising a Silicon-On-Insulator substrate, the method comprising:
forming an insulation layer structure on a single-crystalline silicon substrate having a first region and a second region, wherein the insulation layer structure comprises a plurality of layers having etch selectivities relative to one another;
forming a first insulation layer structure pattern by etching a portion of the insulation layer structure, wherein the first insulation layer structure pattern comprises a first opening exposing at least a portion of a surface of the first region;
filling the first opening with a non-single-crystalline silicon layer;
forming a P-well by forming a single-crystalline silicon pattern formed by irradiating the non-single-crystalline silicon layer with a first laser beam;
forming a second insulation layer structure pattern by etching a portion of the first insulation layer structure, wherein the second insulation layer structure pattern comprises a second opening exposing a surface of the second region;
filling the second opening with a non-single-crystalline silicon-germanium layer;
forming an N-well by forming a single-crystalline silicon-germanium pattern formed by irradiating the non-single-crystalline silicon-germanium layer with a second laser beam;
forming a first plug on the P-well;
forming a second plug on the N-well; and
forming a first channel region and a second channel region on the single-crystalline silicon substrate.

17. The method of claim 16, further comprising forming a buried insulation layer on the single-crystalline silicon substrate after forming the N-well and the P-well.

18. The method of claim 16, wherein:
forming the first channel region comprises using the first plug as a crystallization seed; and
forming the second channel region comprises using the second plug as a crystallization seed.

19. The method of claim 16, further comprising:
forming an N-channel metal oxide semiconductor (NMOS) transistor on the first channel region; and
forming a P-channel metal oxide semiconductor (PMOS) transistor on the second channel region.

20. The method of claim 16, wherein:
irradiating the non-single-crystalline silicon layer with the first laser beam comprises irradiating the first laser beam with an intensity sufficient to melt the non-single-crystalline silicon layer; and
irradiating the non-single-crystalline silicon-germanium layer with the second laser beam comprises irradiating the second laser beam with an intensity sufficient to melt the non-single germanium-silicon layer.

* * * * *